(12) United States Patent
Kim et al.

(10) Patent No.: US 7,570,529 B2
(45) Date of Patent: Aug. 4, 2009

(54) SENSE AMPLIFIER CIRCUIT OF SEMICONDUCTOR MEMORY DEVICE AND METHOD OF OPERATING THE SAME

(75) Inventors: Myeong-O Kim, Suwon-si (KR); Soo-Hwan Kim, Seoul (KR); Jong-Cheol Lee, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 30 days.

(21) Appl. No.: 11/830,142

(22) Filed: Jul. 30, 2007

(65) Prior Publication Data
US 2008/0151664 A1 Jun. 26, 2008

(30) Foreign Application Priority Data
Dec. 22, 2006 (KR) .................. 10-2006-0133208

(51) Int. Cl.
*G11C 7/00* (2006.01)
(52) U.S. Cl. ............ 365/205; 365/189.11; 365/210
(58) Field of Classification Search ........... 365/145, 365/154, 189.01, 189.07, 189.11, 205, 210
See application file for complete search history.

(56) References Cited
U.S. PATENT DOCUMENTS 6,275,961 B1 * 8/2001 Roohparvar .......... 714/718
6,704,218 B2 * 3/2004 Rickes et al. .......... 365/145
6,804,141 B1 * 10/2004 Rickes et al. .......... 365/145

FOREIGN PATENT DOCUMENTS

| JP | 05-054652 | 3/1993 |
| KR | 100206408 B1 | 4/1999 |
| KR | 1020000073689 A | 12/2000 |
| KR | 1020050102952 A | 10/2005 |

OTHER PUBLICATIONS

Korean Office Action in corresponding application No. KR 10-2006-0133208 dated Feb. 27, 2008.

* cited by examiner

*Primary Examiner*—Gene N. Auduong
(74) *Attorney, Agent, or Firm*—F. Chau & Assoc., LLC

(57) ABSTRACT

A sense amplifier circuit of a semiconductor memory device and a method of operating the same, in which the sense amplifier circuit includes a bit line sense amplifier connected with a bit line to sense and amplify a signal of the bit line, and a calibration circuit calibrating a voltage level of the bit line based on a logic threshold value of the bit line sense amplifier. The bit line sense amplifier senses and amplifies the signal of the bit line after the voltage level of the bit line is calibrated. The bit line sense amplifier may include a 2-stage cascade latch, which includes a first inverter having an input terminal connected with the bit line; and a second inverter which has an input terminal connected with an output terminal of the first inverter and an output terminal connected with the bit line and is enabled/disabled in response to a sensing control signal. The calibration circuit includes a switch element that is connected between the output terminal of the first inverter and the bit line and is turned on or off in response to a calibration control signal.

18 Claims, 13 Drawing Sheets

SENSE AMPLIFIER CIRCUIT OF SEMICONDUCTOR MEMORY DEVICE AND METHOD OF OPERATING THE SAME

CROSS-REFERENCE TO RELATED PATENT APPLICATION

This application claims the benefit of Korean Patent Application No. 10-2006-0133208, filed on Dec. 22, 2006, in the Korean Intellectual Property Office, the disclosure of which is incorporated herein in its entirety by reference.

FIELD OF THE INVENTION

The present disclosure relates to a semiconductor device and, more particularly, to a sense amplifier circuit of a semiconductor memory device and a method of sensing a bit line.

BACKGROUND OF THE INVENTION

Semiconductor memory devices include a bit line sense amplifier circuit in order to sense and amplify data stored in a memory cell. The typical sensing method of a bit line sense amplifier is called differential pair sensing, and the most universally used sense amplifier is a cross-coupled latch sense amplifier, in which invalid sensing, that is, sensing of invalid data, may be caused by a mismatch, for example, mismatch in threshold voltage, between circuit elements, for example, transistors.

The structures of the bit lines in semiconductor memory devices may be divided into a folded structure and an open structure. FIG. 1 is a schematic diagram illustrating a conventional folded bit line structure and FIG. 2 is a schematic diagram illustrating a conventional open bit line structure.

Referring to FIG. 1, in a semiconductor memory device using the folded bit line structure, a sense amplifier (S/A) block 110 may be shared by two memory cell blocks 100L and 100R. Memory cells can not be formed at every intersection of the word lines WL and pairs of bit lines BL_L and /BL_L and BL_R and /BL_R. Accordingly, the size of a memory cell array with a folded structure is greater than that in the open bit line structure. When sensing and amplifying memory cell data in the memory cell block 100L, the S/A block 110 is connected with the pair of the bit lines BL_L and /BL_L crossing the memory cell block 100L and senses and amplifies signals of the pair of the bit lines BL_L and /BL_L using the differential pair sensing. At this time, one of the two bit lines BL_L and /BL_L is loaded with a voltage corresponding to the memory cell data and the other bit line acts as a reference voltage line.

Referring to FIG. 2, in a semiconductor memory device using the open bit line structure, an S/A block 210 may also be shared by two memory cell blocks 200L and 200R. Memory cells can be formed at every intersection of the word lines WL and the bit lines BL_L and BL_R. Accordingly, as illustrated in FIG. 2, the size of a memory cell array having the open bit line structure can be reduced, as compared to that using the folded bit line structure. When sensing and amplifying memory cell data in the memory cell block 200L, the S/A block 210 is connected with the bit line BL_L in one memory cell block 200L and the bit line BL_R in the other memory cell block 200R and senses and amplifies signals of the two bit lines BL_L and BL_R using the differential pair sensing. At this time, one bit line BL_L of the two bit lines BL_L and BL_R is loaded with a voltage corresponding to the memory cell data and the other bit line BL_R acts as a reference voltage line. Accordingly, in the open bit line structure, a dummy cell exists in a memory cell block at an edge. Dummy cells are memory cells that can operate normally but cannot be used. As a result the open bit line structure is more advantageous in that the size of a memory cell array is reduced but has a disadvantage of having a dummy cell that cannot be used.

FIG. 3 is a circuit diagram of a conventional cross-coupled latch S/A corresponding to the folded bit line structure illustrated in FIG. 1. Referring to FIG. 3, the S/A block 110 includes an S/A 310, isolation transistors 331L, 331R, 332L and 332R, and a precharge circuit 320.

The isolation transistors 331L, 331R, 332L and 332R are used to selectively connect the S/A block 110 with a memory cell block on one side of the S/A block 110 or a memory cell block on the other side of the S/A block 110. When a first isolation signal ISO_L is activated, first isolation transistors 331L and 332L are turned on to connect the S/A block 110 with the memory cell block on the left, so that the S/A 310 senses and amplifies data in the left memory cell block. The S/A 310 is a cross-coupled latch S/A and senses and amplifies signals of a pair of bit lines BL and /BL using the differential pair sensing. When a second isolation signal ISO_R is activated second isolation transistors 331R and 332R are turned on to connect the S/A block 110 with the memory cell block on the right, so that the S/A 310 senses and amplifies data in the right memory cell block. In other words, the S/A 310 senses signals of a pair of bit lines BL_R and /BL_R in the right memory cell block using the differential pair sensing.

As described above, in the folded bit line structure, the S/A 310 is selectively connected with the left or right memory cell block and therefore, the isolation transistors 331L, 331R, 332L and 332R are needed.

The precharge circuit 320 precharges and equalizes the pair of bit lines BL and /BL with a predetermined precharge voltage VBL in response to a precharge control signal EQ.

The S/A block 110 may further include switching elements 341 and 342 to selectively connect the bit lines BL and /BL with input/output lines IO and /IO, respectively.

FIG. 4 is a circuit diagram of a conventional cross-coupled latch S/A corresponding to the open bit line structure illustrated in FIG. 2. Referring to FIG. 4, the S/A block 210 includes the S/A 310 and the precharge circuit 320, like the S/A block 110 illustrated in FIG. 3. The S/A block 210, however does not require the isolation transistors 331L, 331R, 332L and 332R.

The S/A 310 senses and amplifies a signal of a bit line BL_L in a memory cell block on one side of the S/A block 210 and a signal of a bit line BL_R in a memory cell block on the other side of the S/A block 210 using the differential pair sensing, As described above, the conventional cross-coupled latch S/A 310 senses and amplifies data using the differential pair sensing and requires a reference signal. The S/A 310 that senses and amplifies data through relative comparison using the reference signal is vulnerable to mismatch. Specifically, an error may occur in data sensing due to threshold voltage mismatch between transistors included in the S/A 310, transconductance mismatch between the transistors, or bit line load capacitance mismatch.

Accordingly, to overcome the problems of a dummy cell occurring in the open bit line structure and invalid data sensing occurring due to mismatch between elements in a cross-coupled latch S/A, a new bit line S/A circuit is desired.

SUMMARY OF THE INVENTION

Exemplary embodiments of the present invention provide a bit line sense amplifier circuit for improving a data sensing characteristic and removing a dummy cell or reducing a chip size in a semiconductor memory device and a method of operating the bit line sense amplifier.

According to exemplary embodiments of the present invention, there is provided a sense amplifier circuit of a semiconductor memory device, The sense amplifier circuit includes a bit line sense amplifier configured to be connected with a bit line and to sense and amplify a signal of the bit line, and a calibration circuit configured to calibrate a voltage level of the bit line based on a logic threshold value of the bit line sense amplifier. The bit line sense amplifier senses and amplifies the signal of the bit line after the voltage level of the bit line is calibrated.

The bit line sense amplifier may include a 2-stage cascade latch. The 2-stage cascade latch may include a first inverter having an input terminal connected with the bit line; and a second inverter having an input terminal connected with an output terminal of the first inverter, and an output terminal connected with the bit line, the second inverter being enabled/disabled in response to a sensing control signal. The calibration circuit may include a switch element that is connected between the output terminal of the first inverter and the bit line and is turned on or off in response to a calibration control signal.

According to exemplary embodiments of the present invention, there is provided a semiconductor memory device including a first memory cell array, a first bit line configured to cross the first memory cell array, a bit line sense amplifier configured to be connected with the first bit line and to sense and amplify a signal of the first bit line, and a calibration circuit configured to calibrate a voltage level of the first bit line based on a logic threshold value of the bit line sense amplifier. The bit line sense amplifier senses and amplifies the signal of the first bit line after the voltage level of the bit line is calibrated.

According to exemplary embodiments of the present invention, a method of operating a semiconductor memory device includes precharging a bit line, which is selectively connected to a memory cell, with a predetermined precharge voltage; calibrating a voltage level of the bit line based on a logic threshold value of a bit line sense amplifier connected with the bit line; performing charge sharing between the memory cell and the bit line by enabling a word line and connecting the memory cell to the bit line; and sensing and amplifying a signal of the bit line by enabling the bit line sense amplifier.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Exemplary embodiments of the present invention now will be described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like numbers refer to like elements throughout.

Figure 5:
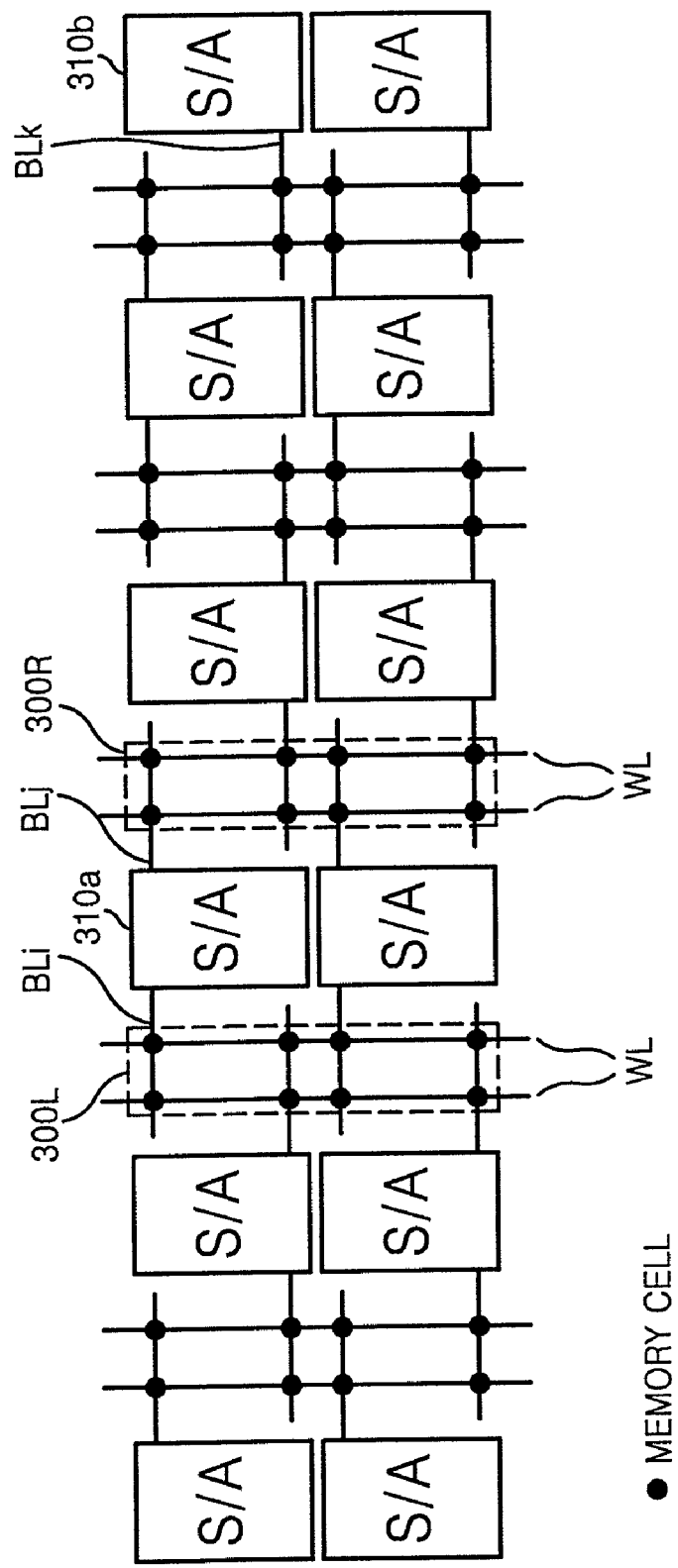
FIG. 5 is a schematic diagram illustrating the connection between memory cell blocks and bit line sense amplifier blocks in a semiconductor memory device according to an exemplary embodiment of the present invention.

FIG. 5 is a schematic diagram illustrating the connection between memory cell blocks and bit line sense amplifier blocks in a semiconductor memory device according to an exemplary embodiment of the present invention. Referring to FIG. 5, a bit line sense amplifier (S/A) block 310a positioned among a plurality of memory cell blocks is connected with at least two memory cell blocks, for example, first and second memory cell blocks 300L and 300R. More specifically: a bit line S/A block 310a is connected with a first bit line BLi crossing a cell array of the first memory cell block 300L and a second bit line BLj crossing a cell array of the second memory cell block 300R and may selectively sense and amplify a signal of the first or second bit line BLi or BLj.

Figure 1:
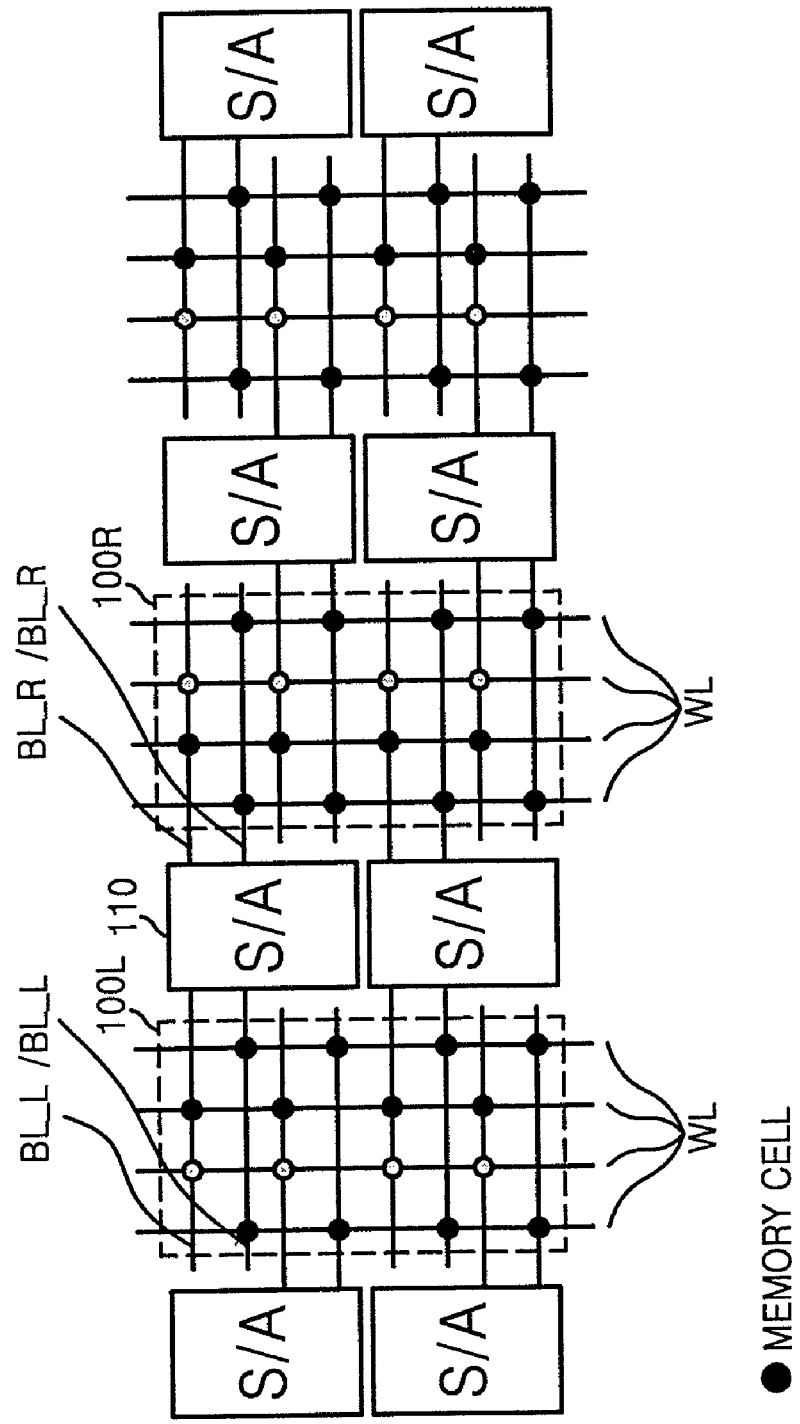
FIG. 1 is a schematic diagram illustrating a conventional folded bit line structure.
Figure 2:
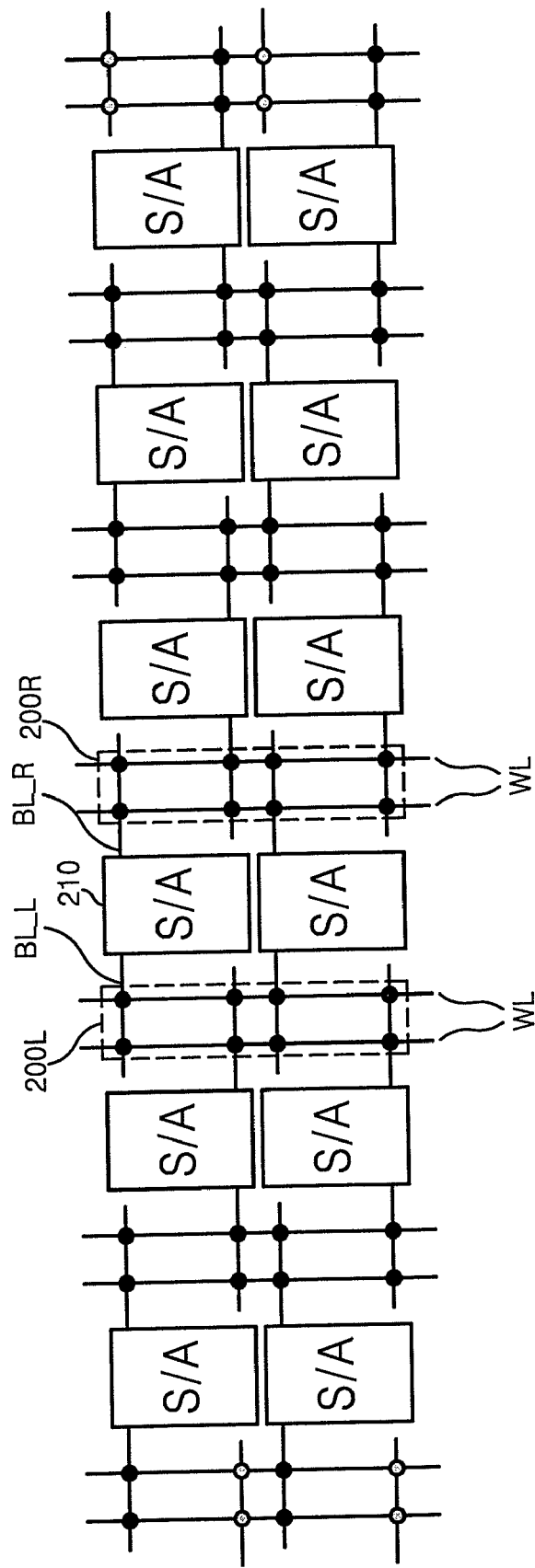
FIG. 2 is a schematic diagram illustrating a conventional open bit line structure.
Figure 3:
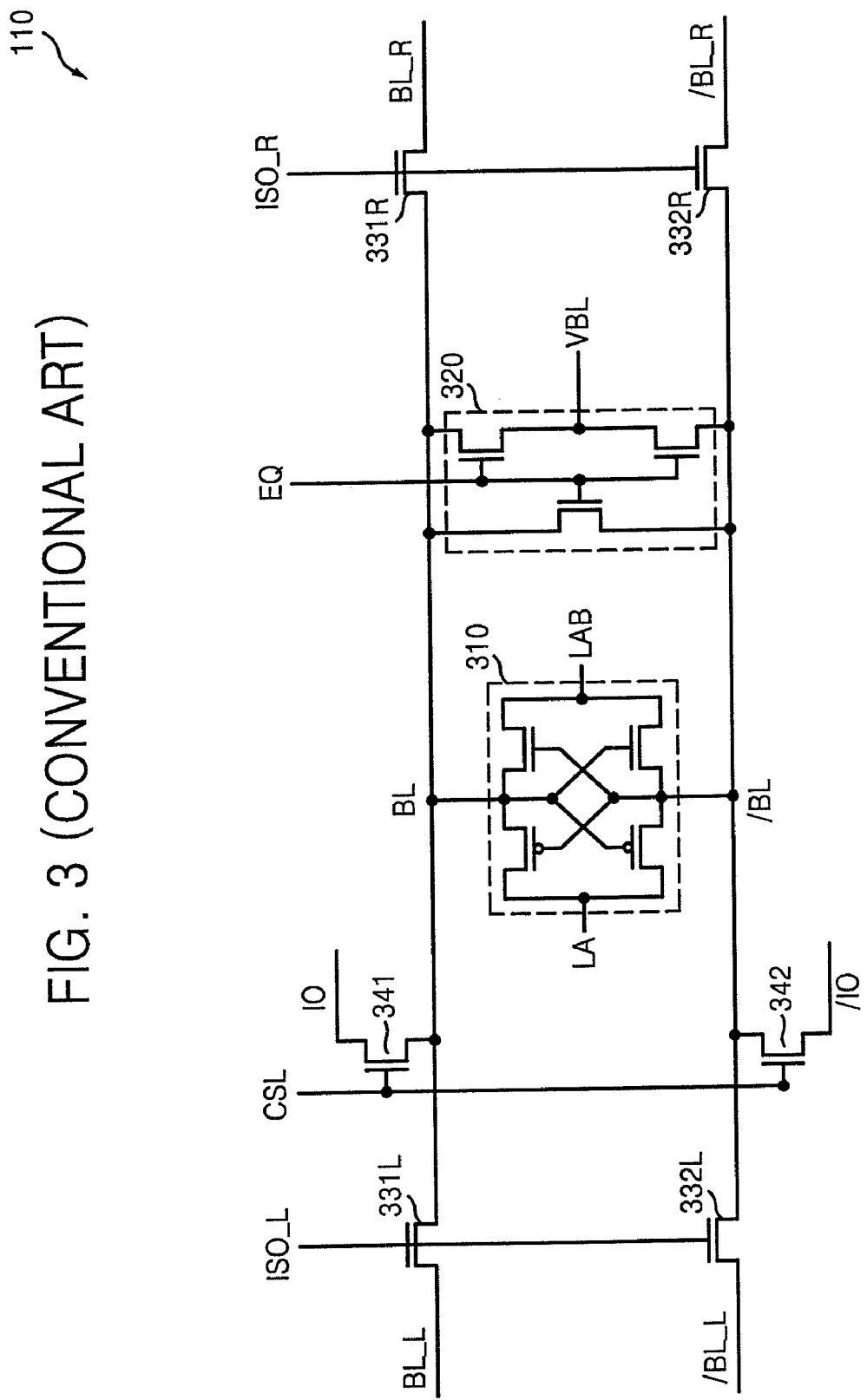
FIG. 3 is a circuit diagram of a conventional cross-coupled latch sense amplifier corresponding to the folded bit line structure.
Figure 4:
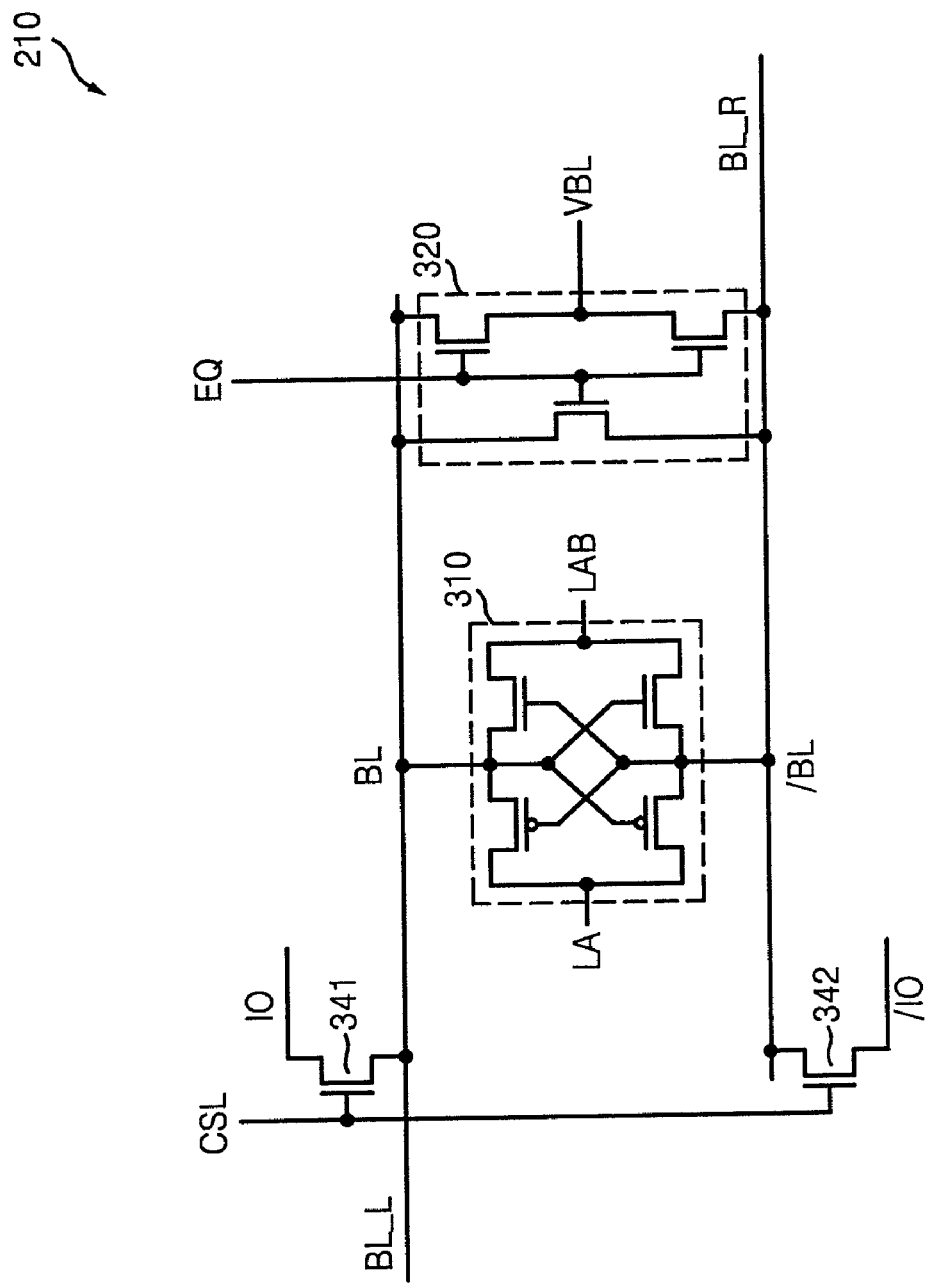
FIG. 4 is a circuit diagram of a conventional cross-coupled latch sense amplifier corresponding to the open bit line structure.

The bit line S/A block 310a senses and amplifies the signal of the first bit line BLi when a word line WL in the first memory cell block 300L is enabled and senses and amplifies the signal of the second bit line BLj when a word lines WL in the second memory cell block 300R is enabled. When sensing and amplifying the signal of the first or second bit line BLi or BLj, the bit line S/A block 310a does not use a voltage of another bit line as a reference but has its own value as the reference. In other words, unlike the conventional cross-coupled latch S/As illustrated in FIGS. 3 and 4, bit line S/A blocks 310a and 310b do not need a reference bit line or a complementary bit line. Therefore, according to exemplary embodiments of the present invention, the bit line S/A block 310b that is positioned at an edge of a cell array and that is connected with a single memory cell block can sense and amplify a signal of a third bit line BLk crossing the cell arrays thereby preventing a dummy cell from occurring in a memory cell block at the edge.

Figure 6:
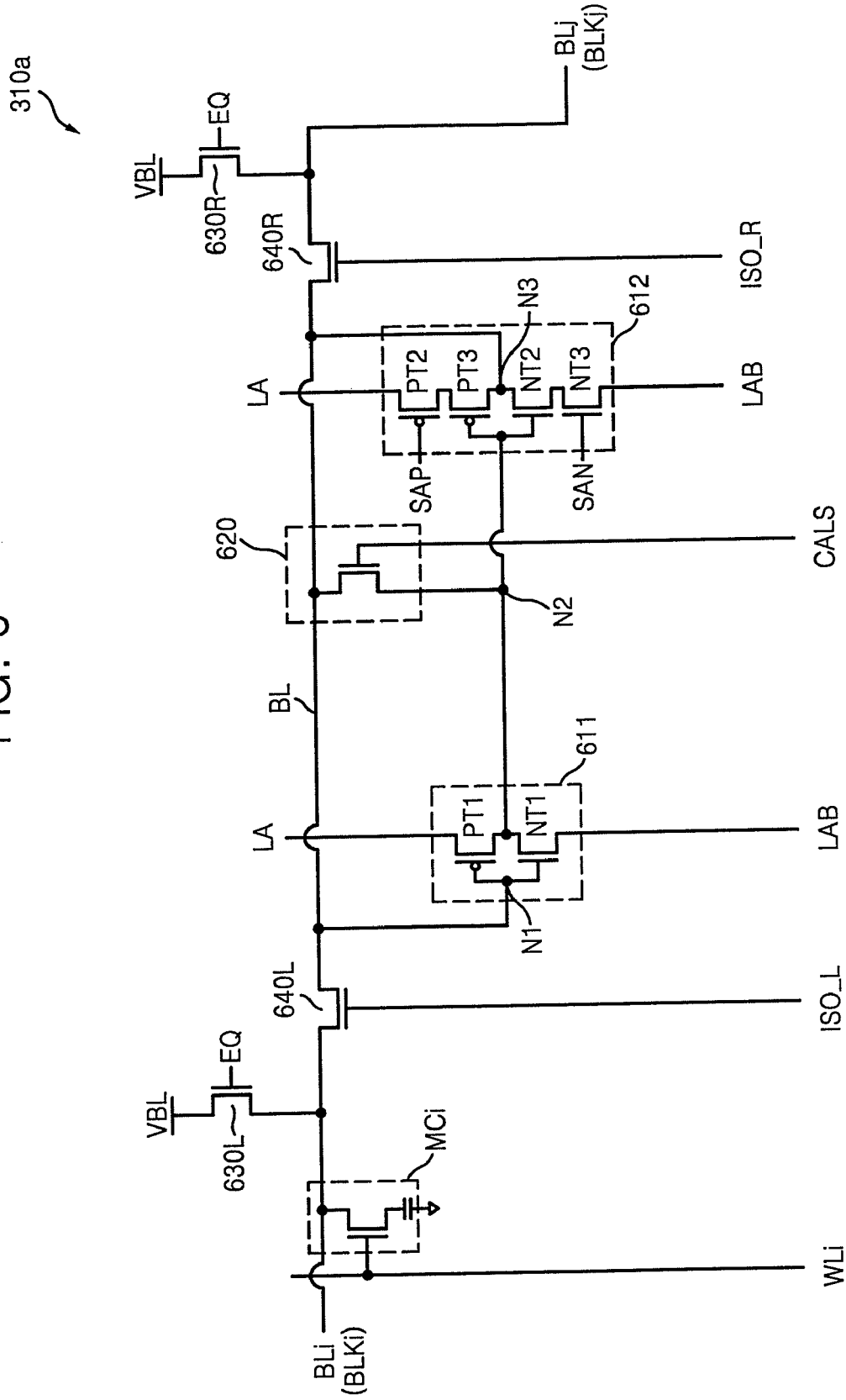
FIG. 6 is a circuit diagram of a bit line sense amplifier block according to an exemplary embodiment of the present invention.

FIG. 6 is a circuit diagram of the bit line S/A block 310a according to an exemplary embodiment of the present invention. Referring to FIG. 6, the bit line S/A block 310a is implemented to be selectively connected with two memory cell blocks. Accordingly, as illustrated in FIG. 5, the bit line S/A block 310a is positioned between two memory cell blocks and can be used to selectively sense and amplify data of either of the two memory cell blocks. The bit line S/A block, 310a includes an S/A circuit, selective connection circuit, and a precharge circuit 630L, 630R.

The S/A circuit includes a bit line S/A and a calibration circuit 620. The bit line S/A may be implemented by a 2-stage cascade latch, which may include first and second inverters 611 and 612 connected with each other in cascade. The first inverter 611 has an input terminal N1 connected with a bit line BL so as to receive a signal of the bit line BL and invert the bit line signal before outputting it. The first inverter 611 may include a first pull-up transistor PT1, which is connected between a first power supply voltage LA and an output terminal N2 and has a gate connected with the bit line BL, and a first pull-down transistor NT1 which is connected between the output terminal N2 and a second power supply voltage LAB and has a gate also connected with the bit line BL.

When calibrating an offset of the bit line S/A 611, 612, the calibration circuit 620 is enabled or turned on in response to a calibration control signal CALS and connects the output terminal N2 of the first inverter 611 to the bit line BL, so that the output terminal N2 and the input terminal N1 of the first inverter 611 are connected with each other. In other words, the calibration circuit 620 provides a negative feedback in which an output of the first inverter 611 is fed back as an input to the first inverter 611, so that a voltage level of the bit line BL is calibrated to be close to a logic threshold value of the first inverter 611. The logic threshold value is a threshold value of an input signal that can cause a transition of the logic level of an output signal. More specifically, when the level of an input signal exceeds the logic threshold value, the logic level of the output signal changes. For instance, in a case where an output of the first inverter 611 is at a logic low when an input voltage of the first inverter 611 is higher than 0.5 V and is at a logic high when the input voltage is lower than 0.5 V, the logic threshold value of the first inverter 611 may be 0.5 V. The calibration circuit 620 may be implemented by a switch element, which is connected between the bit line BL, or the input terminal N1 of the first inverter 611, and the output terminal N2 of the first inverter 611 and is turned on or off in response to the calibration control signal CALS. The switch element may be implemented by a transmission gate or a transistor.

The second inverter 612 has its input terminal connected with the output terminal N2 of the first inverter 611 and an output terminal N3 connected with the bit line BL and may be enabled or disabled in response to first and second sensing control signals SAP and SAN. More specifically, the second inverter 612 may include a first sensing control transistor PT2, which is connected with the first power supply voltage LA and has a gate receiving the first sensing control signal SAP; a second sensing control transistor NT3, which is connected with the second power supply voltage LAB and has a gate receiving the second sensing control signal SAN; a second pull-up transistor PT3, which is connected between the first sensing control transistor PT2 and an output terminal N3 of the second inverter 612 and has a gate receiving the output signal of the first inverter 611; and a second pull-down transistor NT2, which is connected between the output terminal N3 of the second inverter 612 and the second sensing control transistor NT3 and has a gate receiving the output signal of the first inverter 611. The first and second sensing control signals SAP and SAN are signals for controlling enable/disable of the second inverter 612 and may be generated within the semiconductor memory device at an appropriate time. Timing of the first and second sensing control signals SAP and SAN will be described with reference to FIG. 10.

The selective connection circuit is provided to selectively connect or isolate the bit line S/A circuit 611, 612, 620 to or from first and second memory cell blocks BLKi and BLKj and may include first and second selective connectors 640L and 640R that are implemented by isolation transistors. When a first isolation signal ISO_L is activated, the first selective connector 640L responding to the first isolation signal ISO_L is turned on and connects the first memory cell block BLKi to the bit line S/A circuit 611, 612, 620, so that the bit line S/A circuit 611, 612, 620 senses and amplifies data of a memory cell MCi selected in the first memory cell block BLKi, that is, a signal of the first bit line BLi. When a second isolation signal $ISO_{13}$ R is activated, the second selective connector 640R responding to the second isolation signal ISO_R is turned on and connects the second memory cell block BLKj to the bit line S/A circuit 611, 612, 620, so that the bit line S/A circuit 611, 612, 620 senses and amplifies data of a memory cell (not shown) selected in the second memory cell block BLKj, that is, a signal of the second bit line BLj.

The precharge circuit 630L, 630R is provided to set the bit line BL to a bit line precharge voltage VBL in a precharge mode. The precharge circuit 630L, 630R is connected between the bit line BL and the bit line precharge voltage VBL and may be enabled/disabled in response to a precharge control signal EQ.

The bit line S/A block 310a may further include another element, for example, a switching circuit (not shown) for selectively connecting the bit line BL to a data input/output line, in addition to the above-described elements.

Figure 7:
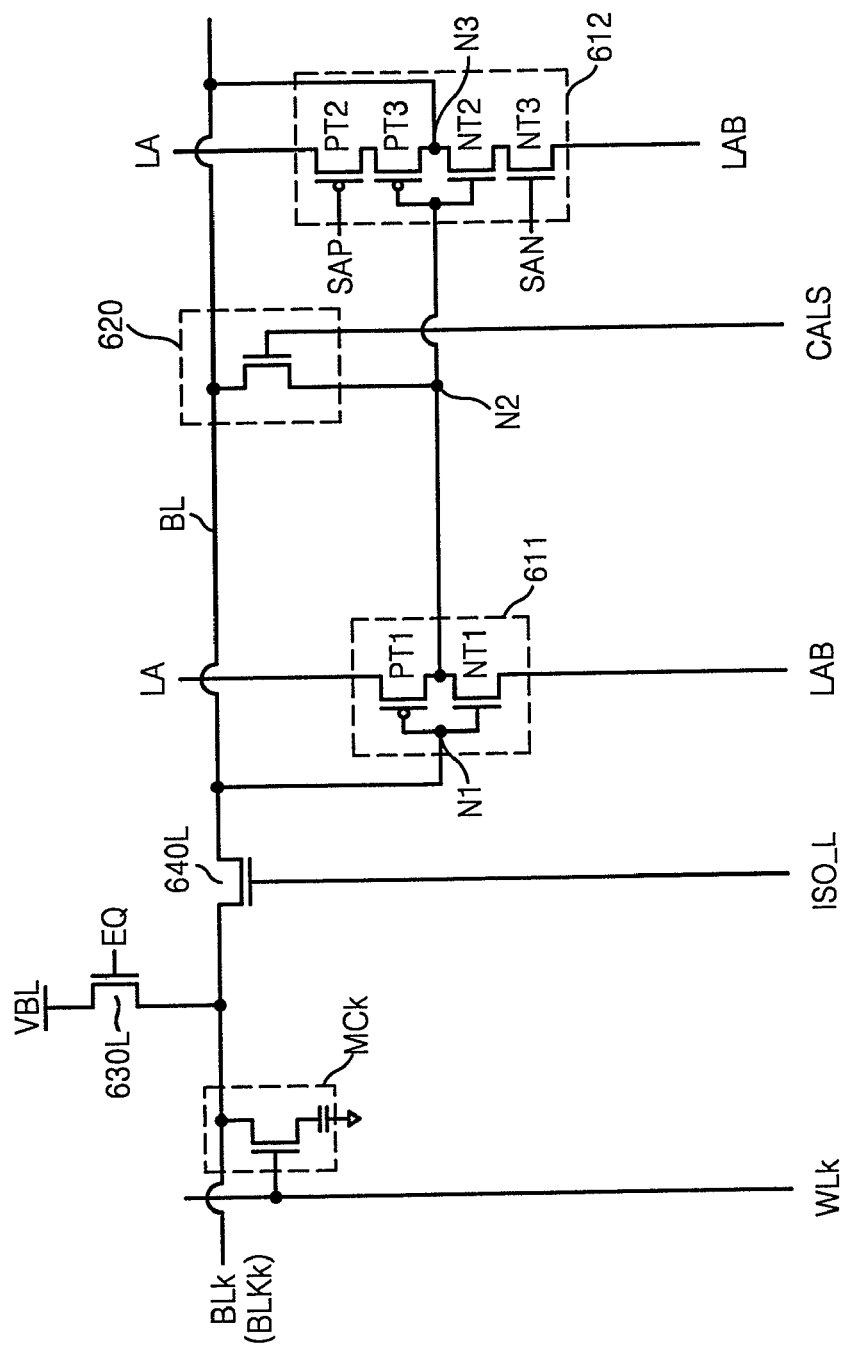
FIG. 7 is a circuit diagram of a bit line sense amplifier block according to an exemplary embodiment of the present invention.

FIG. 7 is a circuit diagram of the bit line S/A block 310b according to an exemplary embodiment of the present invention. The bit line S/A block 310b is implemented to be connected with a single memory cell block. Accordingly, as illustrated in FIG. 5, the bit line S/A block 310b may be positioned at an edge of a memory cell array so as to be used to sense and amplify data of a memory cell block at the edge.

The structure of the bit line S/A block 310b illustrated in FIG. 7 is almost the same as that of the bit line S/A block 310a illustrated in FIG. 6. Because the bit line S/A block 310b is connected with only one memory cell block, however, the bit line S/A block 310b does not need the second selective connector 640R and the portion 630R of the precharge circuit that are illustrated in FIG. 6. In addition, the first selective connector 640L may not be needed, either. With the exception of these differences, the structure and the operation of the bit line S/A block 310b illustrated in FIG. 7 are very similar to those of the bit line S/A block 310a illustrated in FIG. 6. Thus, a detailed description thereof will be omitted.

Figure 8:
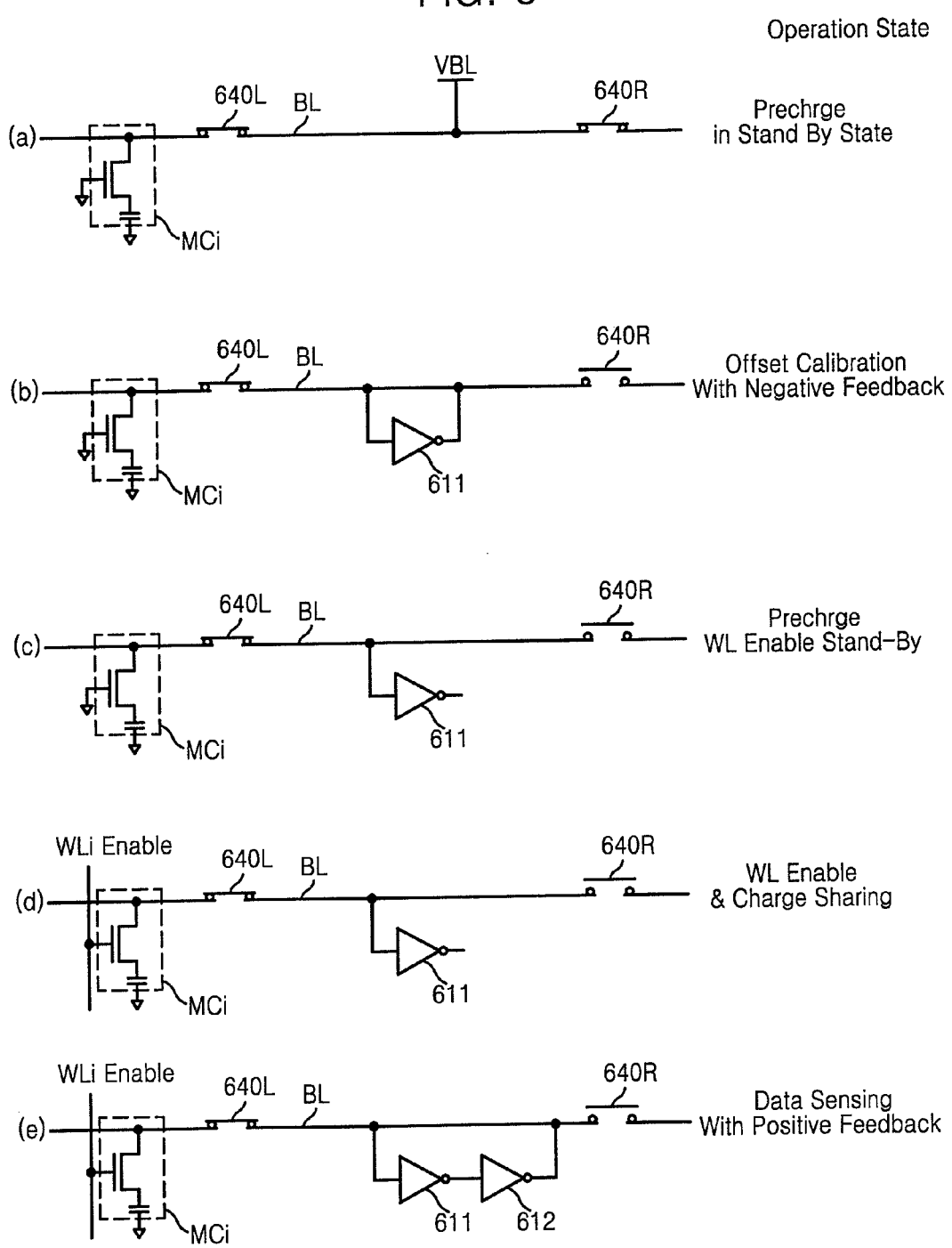
FIG. 8 illustrates the data sensing operation of the sense amplifier block illustrated in FIG. 6.
Figure 10:
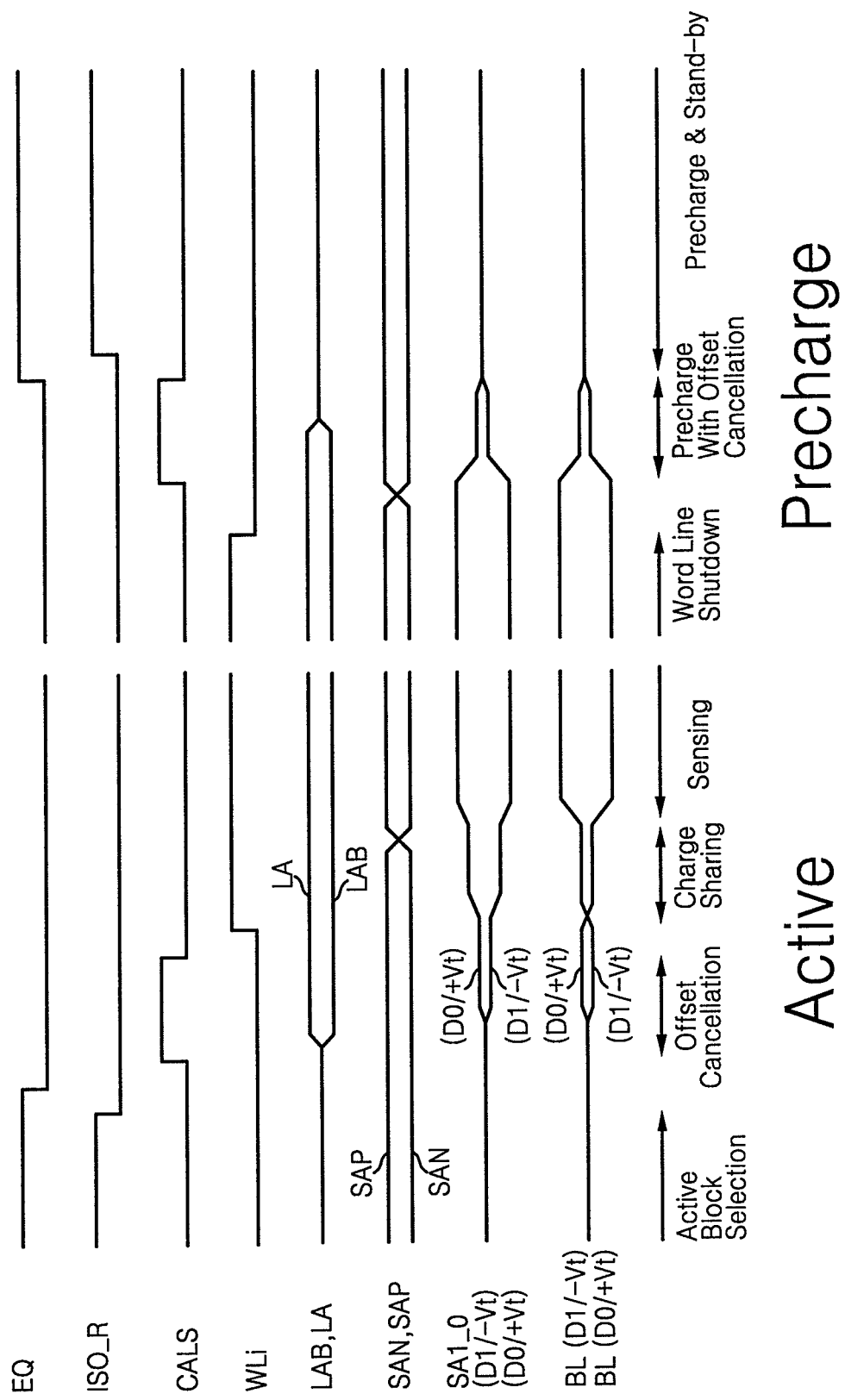
FIG. 10 is a signal timing chart illustrating the operations of the sense amplifier block illustrated in FIG. 6.

FIG. 8 illustrates the data sensing operation of the bit line S/A block 310a illustrated in FIG. 6. FIG. 10 is a signal timing chart illustrating the operations of the bit line S/A block 310a illustrated in FIG. 6. In FIGS. 8 and 10, it is assumed that the first memory cell block BLKi is selected as an active block.

Referring to FIGS. 6, 8, and 10, in a standby state (a) before an active operation, the precharge control signal EQ is activated to a first logic level, for example, a logic high so that the bit line BL is precharged with the precharge voltage VBL.

Next, offset calibration or offset cancellation is performed with respect to the S/A in a state (b) before a word line WLi is enabled, The offset calibration is not a process of changing the characteristics of the S/A but is a process of changing the voltage level of the bit line BL based on the logic threshold value of the S/A.

In the offset calibration state (b), the calibration control signal CALS is activated to the first logic level and the transistor included in the calibration circuit 620 is turned on in response to the calibration control signal CALS activated to the first logic level, so that the input terminal N1 and the output terminal N2 of the first inverter 611 are connected with each other. In other words the output terminal N2 of the first inverter 611 is connected to the input terminal N1 thereof through negative feedback and, therefore, the voltage level of the bit line BL becomes close to the logic threshold value of the first inverter 611.

As described above, the logic threshold value is the level of an input voltage at a time when the logic level of an output voltage transits from one state to another. The logic threshold values of first inverters in each S/A blocks, however, may be slightly different from each other according to manufacturing processes. Accordingly, after the offset calibration of an S/A, the bit line voltage may increase to be higher than the precharge voltage or decrease lower than the precharge voltage. In other words, the bit line voltage is defined as "precharge voltage+offset voltage=logic threshold value of the first inverter". The offset voltage may have a positive or negative value.

After the calibration circuit 620 is turned off in state (c), the selected word line WLi is enabled in state (d). Then, charge sharing is performed between the bit line BL and the selected memory cell MCi. As a result, the bit line voltage may increase or decrease from "precharge voltage VBL+offset voltage", that is, the logic threshold value of the first inverter 611.

In the charge sharing state (d), the first and second sensing control signals SAP and SAN are enabled and the second inverter 612 is enabled. When the second inverter 612 is enabled, positive feedback is performed in state (e). In other words, the first and second inverters 611 and 612 are connected with each other in cascade and the output terminal N3 of the second inverter 612 is connected with the input terminal N1 of the first inverter 611. Accordingly, a bit line signal is sensed and amplified by a 2-stage cascade latch comprised of the first and second inverters 611 and 612 in the state (e).

FIG. 10 shows a waveform (D1/−Vt), where data stored in the selected memory cell MCi is logic high data D1 and the first inverter 611 has a predetermined negative offset voltage −Vt and a waveform (D0/+Vt), where the data stored in the selected memory cell MCi is logic low data D0 and the first inverter 611 has a predetermined positive offset voltage +Vt. In the waveform (D1/−Vt) both an output signal SA1_O of the first inverter 611 and a signal of the bit line BL have a level slightly lower than the level of the precharge voltage VBL during the offset calibration due to the negative offset voltage −Vt. When the charge sharing is performed, however, the signal level of the bit line BL increases due to the logic high data D1. During sensing and amplification, the signal level of the bit line BL rapidly increases. In the waveform (D0/+Vt), both the output signal SA1_O of the first inverter 611 and the signal of the bit line BL have a level slightly higher than the level of the precharge voltage VBL during the offset calibration due to the positive offset voltage +Vt, When the charge sharing is performed, however, the signal level of the bit line BL decreases due to the logic low data D0. During sensing and amplification, the signal level of the bit line BL rapidly decreases.

Through the above-described stages, the data of the selected memory cell MCi is sensed and amplified.

Figure 9:
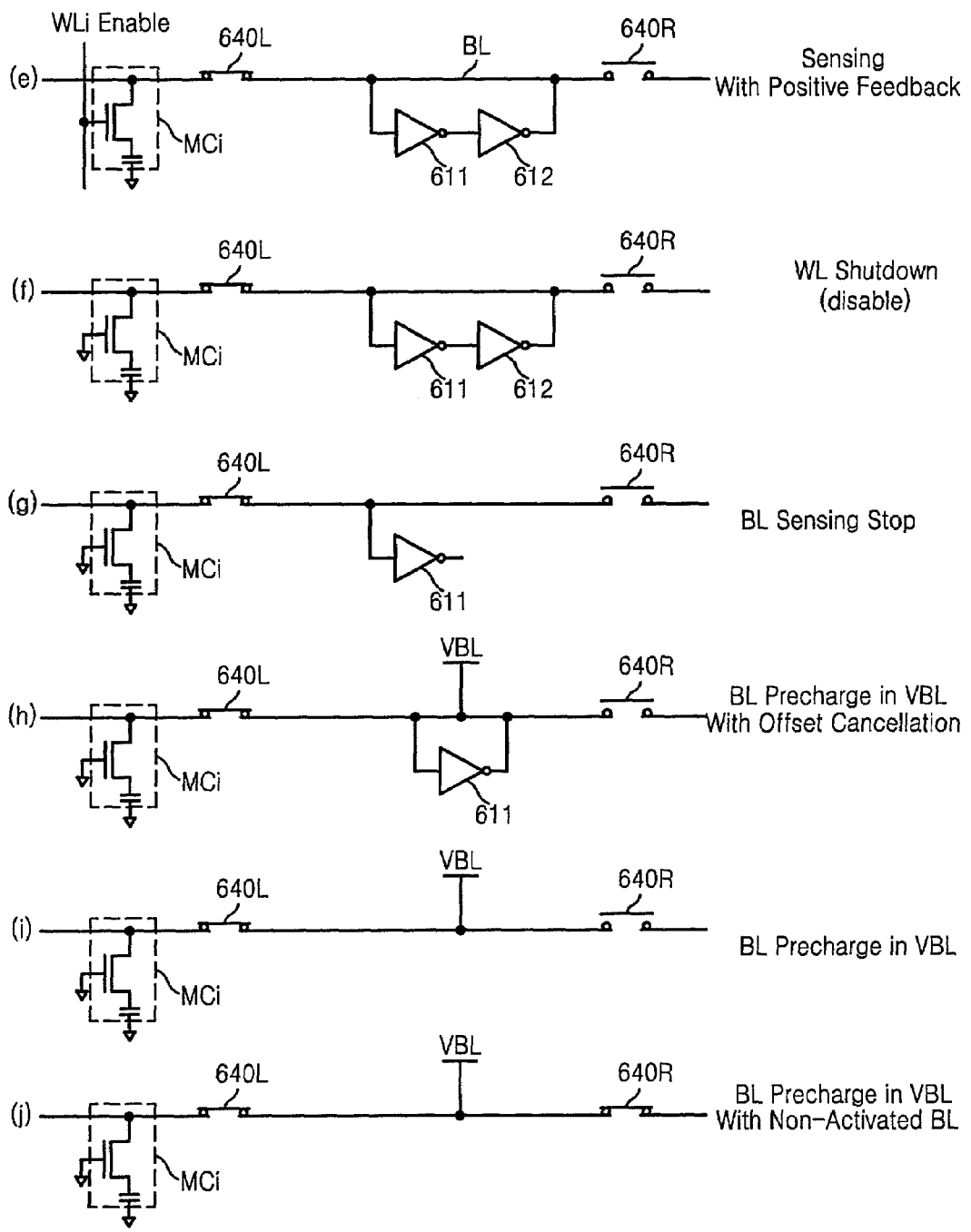
FIG. 9 illustrates a precharge operation performed after the data sensing of the sense amplifier block illustrated in FIG. 6.

FIG. 9 illustrates a precharge operation performed after the data sensing operation of the bit line S/A block 310a illustrated in FIG. 6. Referring to FIGS. 6, 9, and 10, after the data sensing operation of the bit line S/A block 310a is completed, the precharge operation is performed in reverse order to the order of the data sensing operation.

After the data sensing operation is completed in the state (e), the word line WLi is disabled, which is referred to as WL shutdown, in state (f). Next, the first and second sensing control signals SAP and SAN are disabled, so that the second inverter 612 is disabled and the data sensing is stopped in state (g). Next, the calibration control signal CALS is activated to the first logic level and the transistor included in the calibration circuit 620 is turned on in response to the calibration control signal CALS activated to the first logic level, so that the input terminal N1 and the output terminal N2 of the first inverter 611 are connected with each other in state (h). Simultaneously, the precharge voltage VBL is applied to the bit line BL and, therefore, the offset calibration and the bit line precharge can be performed at one time in the state (h). When the offset calibration and the bit line precharge are performed at one time, the voltage of the bit line can be made to quickly reach the level of the precharge voltage VBL.

The calibration control signal CALS is deactivated to a second logic level, for example, a low logic level so as to disable the calibration circuit 620, and the precharge voltage VBL is continuously applied to the bit line BL to perform precharge so that the voltage of the bit line BL becomes the level of the precharge voltage VBL in states (i) and (j).

As described above, according to exemplary embodiments of the present invention, before a word line is enabled, negative feedback to a first inverter is formed so that an offset calibration that allows the voltage of a bit line to be set to be close to the logic threshold value of the first inverter is accomplished. When the word line is enabled after the voltage of the bit line is set to be close to the logic threshold value of the first inverter, if the voltage level of the bit line changes even slightly, the level of an output signal of the first inverter may rapidly change due to charge sharing. Thereafter, when a 2-stage cascade latch amplifies the signal of the bit line, the signal of the bit line can be restored to a voltage level corresponding to sensed data within a short time. Accordingly, a data sensing speed can be improved. In addition, due to the offset calibration of an S/A, influence of mismatch between elements, for example, transistors, included in the S/A can also be reduced.

Figure 11:
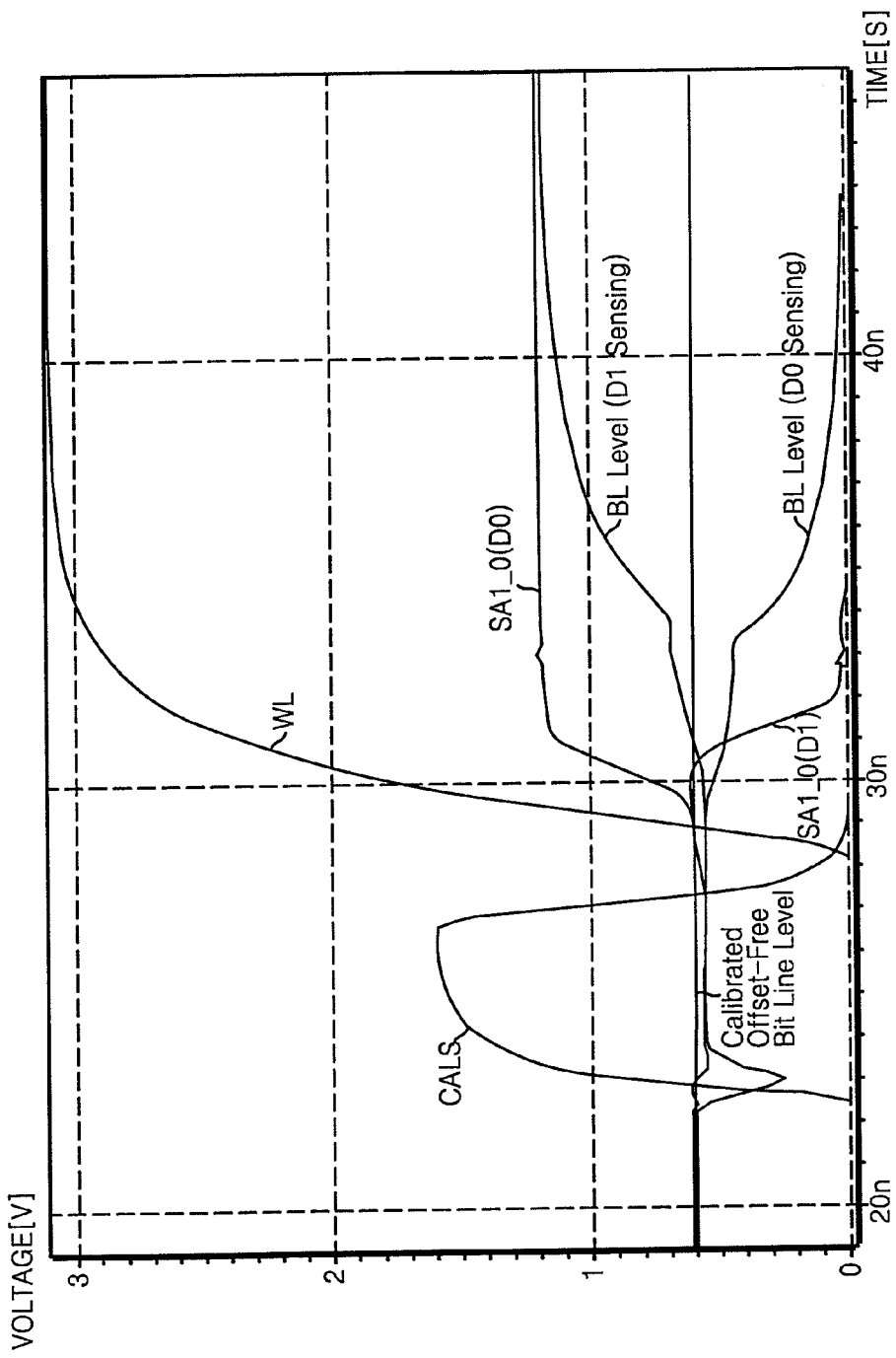
FIGS. 11 and 12 are graphs illustrating the results of simulating the sense amplifier block illustrated in FIG. 6.
Figure 12:
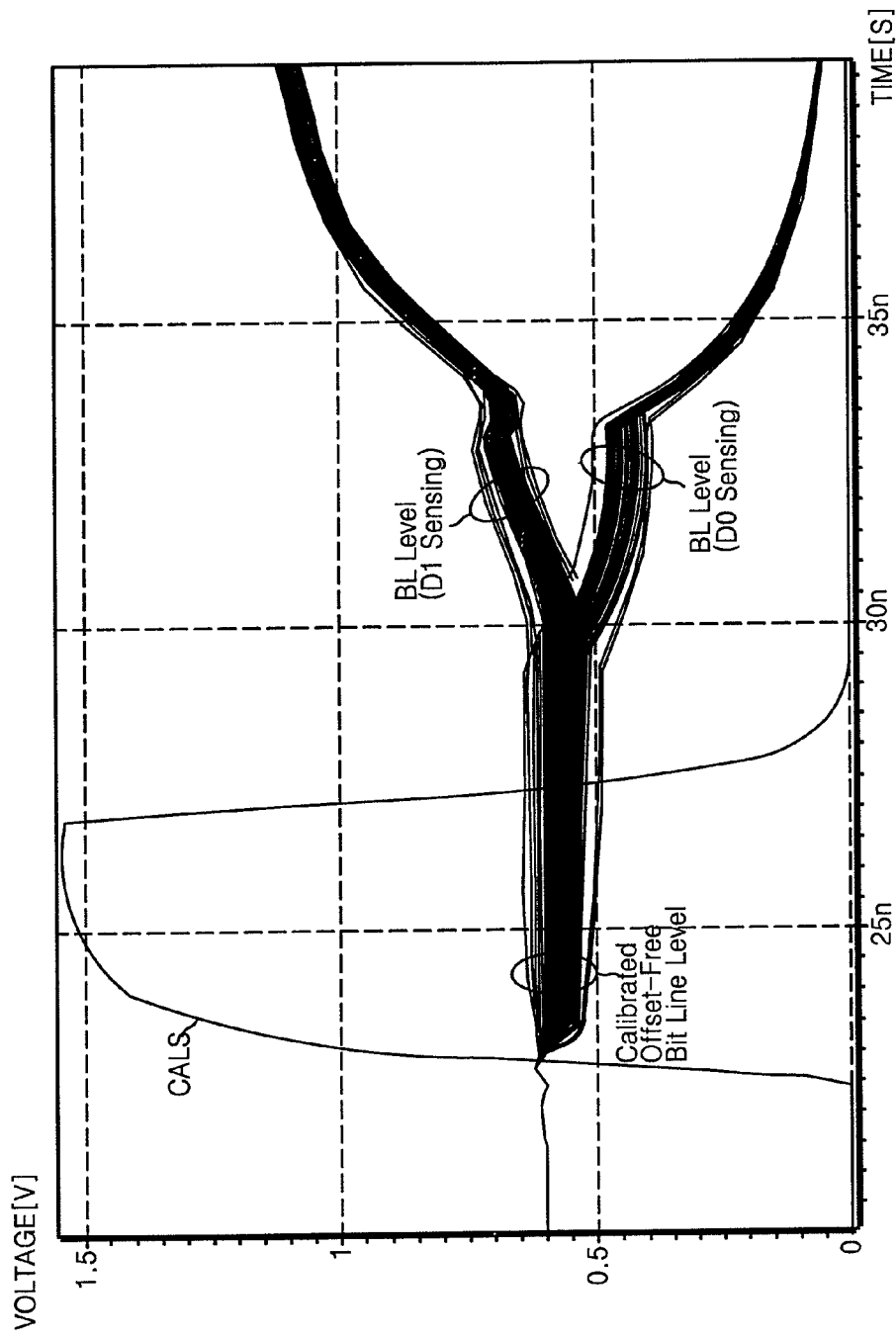

FIGS. 11 and 12 are graphs illustrating results of simulating the bit line S/A block 310a illustrated in FIG. 6. FIG. 11 illustrates the results of simulating the data sensing operation of the bit line S/A block 310a once and FIG. 12 illustrates the results of simulating the data sensing operation of the bit line S/A block 310a 100 times. Referring to FIG. 12, the voltage levels of the bit line BL calibrated through the offset calibration are distributed in a wide range, which means that the distribution of offset voltages of an S/A is wide and also means that the characteristics of elements included in the S/A vary with a process variation. In other words, a mismatch between elements may occur a lot due to the process variation. Despite the fact that the characteristics of the elements change due to the process variation, referring to FIGS. 11 and 12, the data sensing is performed without errors.

Figure 13:
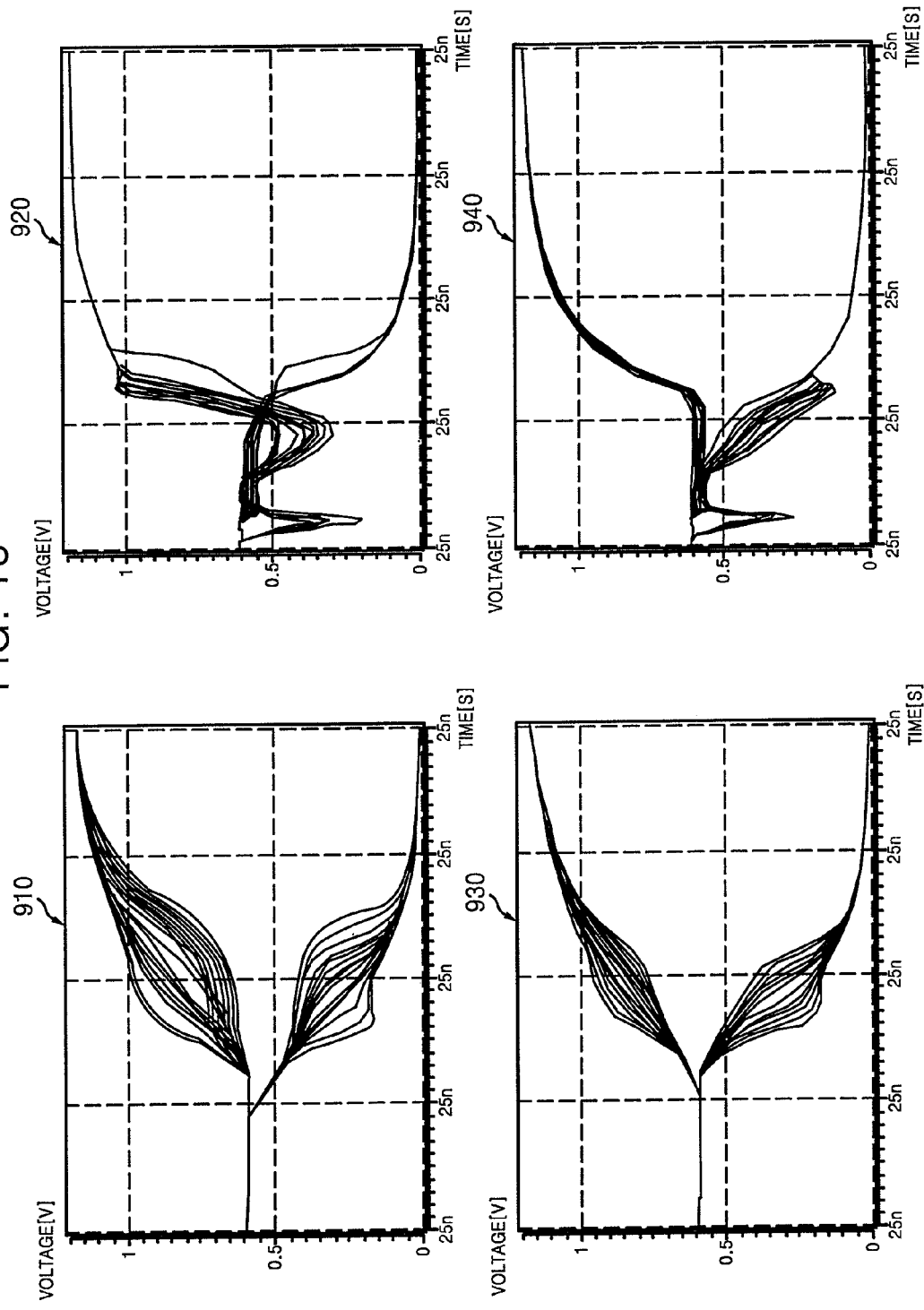
FIG. 13 shows graphs illustrating the comparison between the results of simulating a sense amplifier circuit according to exemplary embodiments of the present invention and the results of simulating a conventional cross-coupled latch sense amplifier circuit.

FIG. 13 shows graphs illustrating the comparison between the results of simulating an S/A circuit according to exemplary embodiments of the present invention and the results of simulating a conventional cross-coupled latch S/A circuit. In FIG. 13, graph 910 illustrates a case where the conventional cross-coupled latch S/A circuit senses and amplifies the logic low data D0. Graph 920 illustrates a case where the S/A circuit of the exemplary embodiment of the present invention senses and amplifies the logic low data D0. Graph 930 illustrates a case where the conventional cross-coupled latch S/A circuit senses and amplifies the logic high data D1. Graph 940 illustrates a case where the S/A circuit of the exemplary embodiment of the present invention senses and amplifies the logic high data D1.

Referring to FIG. 13, the conventional cross-coupled latch S/A circuit has a very wide distribution of data sensing and amplifying speeds. In other words, it occurs that a speed of sensing and amplifying data according to the process variation is very slow. On the contrary, the S/A circuit of the exemplary embodiment of the present invention has a relatively narrow distribution of data sensing and amplifying speeds. In other words, the S/A circuit of the exemplary embodiment of the present invention is not sensitive to the process variation and, thus, is not much affected by mismatch between elements, for example, transistors, included in an S/A.

As described above, according to exemplary embodiments of the present invention, an S/A circuit is not affected much by the process variation or mismatch between elements, for example, transistors, and, therefore, errors are reduced in data sensing. As a result, a data sensing characteristic is improved. In addition, the S/A circuit does not need another bit line acting as a reference, thereby preventing dummy memory cells, As a result, the size of a memory cell array can be reduced.

While the present invention has been shown and described with reference to exemplary embodiments thereof, it will be understood by those of ordinary skill in the art that various changes in form and detail may be made herein without departing from the spirit and scope of the present invention, as defined by the following claims.

What is claimed is:

1. A sense amplifier circuit of a semiconductor memory device, comprising:
   a bit line sense amplifier configured to be connected with a bit line and to sense and amplify a signal of the bit line; and
   a calibration circuit configured to calibrate a voltage level of the bit line based on a logic threshold value of the bit line sense amplifier,
   wherein the bit line sense amplifier includes a 2-stage cascade latch, and senses and amplifies the signal of the bit line after the voltage level of the bit line has been calibrated.

2. The sense amplifier circuit of claim 1, wherein the 2-stage cascade latch comprises:
   a first inverter having an input terminal connected with the bit line; and
   a second inverter having an input terminal connected with an output terminal of the first inverter and an output terminal connected with the bit line, the second inverter being enabled/disabled in response to a sensing control signal fed thereto.

3. The sense amplifier circuit of claim 2, wherein the calibration circuit comprises a switch element that is connected between the output terminal of the first inverter and the bit line and is turned on or off in response to a calibration control signal fed thereto.

4. The sense amplifier circuit of claim 3, wherein the switch element comprises one of a transistor and a transmission gate.

5. The sense amplifier circuit of claim 4, wherein the first inverter comprises:
   a first pull-up transistor that is connected between a first power supply voltage and the output terminal of the first inverter and has a gate connected with the bit line; and
   a first pull-down transistor that is connected between the output terminal of the first inverter and a second power supply voltage and has a gate connected with the bit line.

6. The sense amplifier circuit of claim 5, wherein the sensing control signal comprises a first sensing control signal and a second sensing control signal, and
   wherein the second inverter comprises:
   a first sensing control transistor that is connected with the first power supply voltage and has a gate receiving the first sensing control signal;
   a second sensing control transistor that is connected with the second power supply voltage and has a gate receiving the second sensing control signal;
   a second pull-up transistor that is connected between the first sensing control transistor and the output terminal of the second inverter and has a gate receiving an output signal of the first inverter; and
   a second pull-down transistor that is connected between the output terminal of the second inverter and the second sensing control transistor and has a gate receiving the output signal of the first inverter.

7. A semiconductor memory device comprising:
   a first memory cell array;
   a first bit line configured to cross the first memory cell array;
   a bit line sense amplifier configured to be connected with the first bit line and to sense and amplify a signal of the first bit line; and
   a calibration circuit configured to calibrate a voltage level of the first bit line based on a logic threshold value of the bit line sense amplifier,
   wherein the bit line sense amplifier includes a 2-stage cascade latch, and senses and amplifies the signal of the first bit line after the voltage level of the bit line has been calibrated.

8. The semiconductor memory device of claim 7, wherein the 2-stage cascade latch comprises:
   a first inverter having an input terminal connected with the first bit line; and
   a second inverter having an input terminal connected with an output terminal of the first inverter and an output terminal connected with the first bit line, the second inverter being enabled/disabled in response to a sensing control signal fed thereto.

9. The semiconductor memory device of claim 8, wherein the calibration circuit comprises a switch element that is connected between the output terminal of the first inverter and the first bit line and is turned on or off in response to a calibration control signal fed thereto.

10. The semiconductor memory device of claim 8, further comprising:
   a second memory cell array; and
   a second bit line crossing the second memory cell array,
   wherein the bit line sense amplifier selectively senses and amplifies the signal of the first bit line and a signal of the second bit line.

11. The semiconductor memory device of claim 10, further comprising a precharge circuit configured to precharge the first bit line and the second bit line with a predetermined precharge voltage in response to a precharge control signal fed thereto.

12. The semiconductor memory device of claim 10, further comprising:
   a first selective connection circuit configured to selectively connect the first bit line to the bit line sense amplifier in response to a first isolation signal; and
   a second selective connection circuit configured to selectively connect the second bit line to the bit line sense amplifier in response to a second isolation signal.

13. A method of operating a semiconductor memory device, the method comprising:
   precharging a bit line that is selectively connected to a memory cell with a predetermined precharge voltage;
   calibrating a voltage level of the bit line based on a logic threshold value of a bit line sense amplifier connected with the bit line;
   performing charge sharing between the memory cell and the bit line by enabling a word line and connecting the memory cell to the bit line; and
   sensing and amplifying a signal of the bit line by enabling the bit line sense amplifier,
   wherein the bit line sense amplifier performs latching using a 2-stage cascade latch.

14. The method of claim 13, wherein the 2-stage cascade latch comprises a first inverter and a second inverter that are connected with each other in cascade, and
   wherein the step of calibrating the voltage level of the bit line comprises connecting both of an input terminal and an output terminal of the first inverter to the bit line.

15. The method of claim 14, wherein the step of sensing and amplifying the signal of the bit line comprises connecting an input terminal of the second inverter with the output terminal of the first inverter and connecting an output terminal of the second inverter with the bit line.

16. The method of claim 15, further comprising electrically isolating the output terminal of the first inverter from the bit line after the step of calibrating and before the steps of sensing and amplifying.

17. The method of claim 15, further comprising:
   disabling the word line;
   disabling the second inverter; and
   simultaneously performing offset calibration and bit line precharge by connecting both of the input and output terminals of the first inverter to the bit line and applying the precharge voltage to the bit line.

18. The method of claim 17, wherein the step of precharging the bit line is performed after the step of offset calibration and simultaneously with the step of precharging bit line.

* * * * *